United States Patent
Kenney et al.

(10) Patent No.: US 12,153,863 B2
(45) Date of Patent: Nov. 26, 2024

(54) MULTI-PROCESSOR SIMULATION ON A MULTI-CORE MACHINE

(71) Applicant: Synopsys, Inc., Sunnyvale, CA (US)

(72) Inventors: James Kenney, Oxfordshire (GB); Simon Davidmann, Oxfordshire (GB)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/105,554

(22) Filed: Feb. 3, 2023

(65) Prior Publication Data
US 2023/0185991 A1 Jun. 15, 2023

Related U.S. Application Data

(63) Continuation of application No. 15/030,216, filed as application No. PCT/GB2014/053113 on Oct. 16, 2014, now Pat. No. 11,574,087.

(30) Foreign Application Priority Data

Oct. 18, 2013 (GB) ...................................... 1318473

(51) Int. Cl.
*G06F 30/3308* (2020.01)
*G06F 9/48* (2006.01)
(Continued)

(52) U.S. Cl.
CPC ........ *G06F 30/3308* (2020.01); *G06F 9/4881* (2013.01); *G06F 9/522* (2013.01); *G06F 30/20* (2020.01); *G06F 30/33* (2020.01)

(58) Field of Classification Search
CPC ........ G06F 30/20; G06F 30/33; G06F 9/4881; G06F 9/522
See application file for complete search history.

(56) References Cited

U.S. PATENT DOCUMENTS 6,263,302 B1 * 7/2001 Hellestrand ............. G06F 30/33
703/22
2006/0195825 A1 8/2006 Vanspauwen et al.
(Continued)

FOREIGN PATENT DOCUMENTS

| CN | 102591759 A | 7/2012 |
|---|---|---|
| CN | 102591759 B | 8/2014 |
| EP | 0270983 A2 | 6/1988 |

OTHER PUBLICATIONS

Bergan, et al., "CoreDet," Proc. of the Fifteenth Edition of ASPLOS on Architectural Support for Programming Languages and Operating Systems, ASPLOS '10, Jan. 1, 2010, p. 53 XP055158157, Jan. 1, 2010.

(Continued)

*Primary Examiner* — Bijan Mapar
(74) *Attorney, Agent, or Firm* — Fenwick & West LLP (57) ABSTRACT

The invention relates to methods of simulation of a plurality of processors running on a plurality of cores, to multi-core microprocessor systems in which such methods may be carried out, and to computer program products configured to perform a simulation of a plurality of processors, running on a plurality of cores. According to a first aspect of the invention, there is provided a method of running a plurality of simulated processors on a plurality of cores, in which simulation of the processors is performed in parallel on the plurality of cores.

39 Claims, 5 Drawing Sheets

(51) Int. Cl.
  *G06F 9/52* (2006.01)
  *G06F 30/20* (2020.01)
  *G06F 30/33* (2020.01)

(56) References Cited

U.S. PATENT DOCUMENTS

2006/0229861 A1* 10/2006 Tatsuoka .................. G06F 9/52
                                                          714/E11.167
2008/0208555 A1   8/2008 Tatsuoka et al.
2012/0191441 A1   7/2012 Wu et al.

OTHER PUBLICATIONS

Bo-Han Zeng, et al., "An efficient hybrid synchronization technique for scalable multi-core instruction set simulations", Design Automation Conference (ASP-DAC), 2013 18th ASIA and South Pacific, IEEE, pp. 588-593 XP032385877, Jan. 22, 2013.

Jiun-Hung Ding, et al., "PQEMU: A parallel system emulator based on QEMU", Parallel ad Distributed Systems (ICPADS), 2011 IEEE 17th Intl. Conference on, pp. 276-283 XP032087287, Dec. 7, 2011.

Meng-Huan Wu, et al., "An effective synchronization approach for fast and accurate multi-core instruction-set simulation", Proc. of the Seventh ACM Intl. Conference on Embedded Software, EMSOFT '09, p. 197 XP055157527, Jan. 1, 2009.

Meng-Huan Wu et al., et al., "A distributed timing synchronization technique for parallel multi-core instruction-set simulation", ACM Transactions on Embedded Computing Systems, ACM, NYU, NY vol. 12, No. 1s, pp. 1-24 XP058013498, Mar. 29, 2013.

Over, et al., "A Comparison of Two Approaches to Parallel Simulation of Multiprocessors", Performance Analysis of Systems & Software, ISPASS 20007, International Symposium on, pp. 12-22 XP031091884, Apr. 1, 2007.

Razaghi, et al., "Host-compiled multicore RTOS simulator for embedded real-time software development", Design, Automation & Test in Europe Conference & Exhibition, 2011, IEEE, pp. 1-6 XP032318138, Mar. 14, 2011.

Wang, et al., "Coremu", Proc. of the 16th ACM Symposium on Principles and Practice of Parallel Programming, PPOPP '11, p. 213 XP055157566, Jan. 11, 2011.

Witchel, et al., "EMBRA: fast and flexible machine simulation", 1996 ACM Sigmetrics Intl. Conference on Measurement and Modeling of Computer Systems, Phila., pp. 68-79 XP000679316, May 23, 1996.

* cited by examiner

MULTI-PROCESSOR SIMULATION ON A MULTI-CORE MACHINE

CROSS-REFERENCE TO RELATED APPLICATIONS

This application is a continuation of U.S. application Ser. No. 15/030,216, filed on Apr. 18, 2016, which claims the priority of PCT/GB2014/053113, filed on Oct. 16, 2014, which claims the benefit of priority to Great Britain Application No. 1318473.4, filed on Oct. 18, 2013, the entire contents of each of which are fully incorporated herein by reference.

BACKGROUND OF THE INVENTION

1. Field of the Invention

The field of the invention relates to methods of simulation of a plurality of processors running on a plurality of cores, to multi-core microprocessor systems in which such methods may be carried out, and to computer program products operable to perform a simulation of a plurality of processors, runnable on a plurality of cores.

2. Technical Background

The advent of multi-core microprocessors, i.e. processors which contain two or more execution units which can run concurrently, has opened up a new range of possibilities for high speed simulation. There are, however, a number of challenges as, in order to take full advantage of the potential simulation speed benefit offered by multi-core machines, any simulator running on such a machine must be able to make effective use of the parallelism offered by the multi-core technology.

For clarity, the term 'core' will be used to refer to any one core of a multi-core processor within the host machine(s) and the term 'processor' will refer to the simulated processor, i.e. the model of a processor, on which the instruction set is being run.

A multi-core processor is a single computing component with two or more independent (or mostly independent) actual central processing units (CPUs) (called "cores"), which are the units that read and execute program instructions. The instructions may be ordinary CPU instructions such as add, move data, and branch, but the multiple cores can run multiple instructions at the same time, increasing overall speed for programs amenable to parallel computing. Manufacturers typically integrate the cores onto a single integrated circuit die (known as a chip multiprocessor or CMP), or onto multiple dies in a single chip package.

The improvement in performance gained by the use of a multi-core processor depends very much on the software algorithms used and their implementation. In particular, possible gains are limited by the fraction of the software that can be run in parallel simultaneously on multiple cores. Most applications, however, are not accelerated so much unless programmers invest a prohibitive amount of effort in re-programming the whole problem.

Maximizing the utilization of the computing resources provided by multi-core processors typically requires adjustments both to the operating system (OS) support and to existing application software.

Integration of a multi-core chip drives chip production yields down and they are more difficult to manage thermally than lower-density single-chip designs.

3. Discussion of Related Art

CN102591759(A) and CN102591759(B) disclose, in their own terminology, a clock precision parallel simulation system for an on-chip multi-core processor, which comprises a processor subsystem, a storage subsystem and a simulation object subsystem. The system is characterized in that a module interlayer is arranged between the processor subsystem and the simulation object subsystem in the system and used for implementation of mapping from a logic processor to a simulation object machine, the module interlayer comprises a core module, a mapping interconnection network, a share cache memory, a memory and storage modules for other simulation object structures, wherein the core module is in one-to-one correspondence to a processor core and a private primary cache memory. Point-to-point synchronization is realized between the core module and the storage modules, and group synchronization is realized among the storage modules. The system has higher degree of parallelism and higher speed-up ratio, and performance of the system is promoted under the condition that delicate modeling of each component of the multi-core processor is maintained.

SUMMARY OF THE INVENTION

According to a first aspect of the invention, there is provided a method of running a plurality of simulated processors on a plurality of cores, in which simulation of the processors is performed in parallel on the plurality of cores.

An advantageous technical effect is that parallel processing is provided for a plurality of simulated processors. The technical effect operates at the level of the architecture of the computer component implementing the method; the technical effect is produced irrespective of the data being processed or the applications being run. Furthermore, a computer implementing the first aspect of the invention operates in a new way.

The method may be one applying to a timeslice of the plurality of simulated processors runnable on the plurality of cores, the method including the steps of:

(i) determining an instruction list for each processor for the timeslice;

(ii) allocating processors which have not yet been simulated in the timeslice to run on any available cores;

(iii) for each allocated processor, running to the end of the timeslice and saving the simulation state of the processor as it completes the timeslice, and (iv) returning to step (ii) unless the plurality of processors have all been simulated in this timeslice.

The method may be one wherein the number of the plurality of simulated processors exceeds the number of the plurality of cores.

The method may be one wherein the number of the plurality of simulated processors does not exceed the number of the plurality of cores.

The method may be one in which the method is repeated for a set of consecutive timeslices.

The method may be one further including a method of ensuring correct synchronization of a plurality of simulated processors, the plurality of simulated processors running on a plurality of cores, the method applying to a timeslice of the plurality of simulated processors running on the plurality of cores, including:

running each processor on a core, and for each processor, suspending the processor if a synch event is found, or running the processor to the end of the timeslice, if a synch event is not found.

An advantageous technical effect is that data structure consistency is supported, which strongly reduces the occurrences of crashes, or use of erroneous data, by a computer implementing this aspect of the invention. The technical effect operates at the level of the architecture of the computer component; the technical effect is produced irrespective of the data being processed or the applications being run. Furthermore, the computer implementing this aspect of the invention operates in a new way. The computer is a better computer in the sense of running more efficiently and effectively as a computer.

The method may be one including the steps of:
(i) determining an instruction list for each processor for the timeslice;
(ii) allocating processors which have not yet been simulated in the timeslice to run on any available cores;
(iii) if a synch event is found for a processor, running the processor to just before the synch event, suspending the processor, and saving the simulation time and the simulation state of the processor;
(iv) if a synch event is not found for a processor, running to the end of the timeslice and saving the simulation state of the processor as it completes the timeslice, and
(v) returning to step (ii) unless the plurality of processors have all been simulated in this timeslice.

The method may be one further including a method of completing a timeslice of a simulation of a plurality of processors running on a plurality of cores, in which a plurality of processors have been suspended, including:
running the suspended processors, consecutively in the order of their earliest simulation time, on the same core, to ensure data structure consistency.

An advantageous technical effect is that data structure consistency is supported, which strongly reduces the occurrences of crashes, or use of erroneous data, by a computer implementing this aspect of the invention. The technical effect operates at the level of the architecture of a computer or of a computer component; the technical effect is produced irrespective of the data being processed or the applications being run. Furthermore, the computer implementing this aspect of the invention operates in a new way. The computer is a better computer in the sense of running more efficiently and effectively as a computer.

The method may be one including the steps of:
(i) reading a list of remaining suspended processors;
(ii) checking the simulation time for each suspended processor;
(iii) running the processor with the earliest simulation time, and removing that processor from the list;
(iv) if a synch event is found, suspending the process, saving the simulation state and time, adding the processor back to the list of remaining suspended processors and returning to step (i);
(v) running to the end of the timeslice and saving the simulation, and
(vi) repeating steps (i) to (v) until the list is empty,
wherein step (iii) is performed on the same core, to ensure data structure consistency.

The method may be one further including a method of timeslicing instruction sets for a plurality of processors to be simulated using a plurality of cores, including the steps of:
(i) determining a timeslice time period;
(ii) for each processor model, consulting a record of its timing information;
(iii) for each simulated processor, estimating how many instructions will be run in the time period, using the results of step (ii);
(iv) determining an instruction list for each simulated processor, according to the results of (iii), for a timeslice.

An advantageous technical effect is that different processors can be simulated using a plurality of cores, because for each processor model, a record is consulted of its timing information. This means that a greater set of simulations are possible, because the simulation is not limited to a single model of processor. The technical effect operates at the level of the architecture of the computer; the technical effect is produced irrespective of the data being processed or the applications being run. Furthermore, the computer implementing this aspect of the invention operates in a new way.

The method may be one further including the step of:
(v) repeating (i) to (iv) for a set of consecutive timeslices.
The method may be one wherein a time period is user-defined.
The method may be one wherein a time period is pre-defined.
The method may be one wherein a single core runs a single processor's instruction list at any one time.

According to a second aspect of the invention, there is provided a multi-core microprocessor system including a plurality of execution units which can run concurrently, the system configured to run a plurality of simulated processors on a plurality of cores, in which simulation of the processors is performable in parallel on the plurality of cores.

The multi-core microprocessor system may be configured to complete a timeslice of a simulation of a plurality of processors running on a plurality of cores, configured to:
(i) determine an instruction list for each processor for the timeslice;
(ii) allocate processors which have not yet been simulated in the timeslice to run on any available cores;
(iii) for each allocated processor, run to the end of the timeslice and save the simulation state of the processor as it completes the timeslice, and
(iv) return to (ii) unless the plurality of processors have all been simulated in this timeslice.

The multi-core microprocessor system may be one wherein the number of the plurality of simulated processors exceeds the number of the plurality of cores.
The multi-core microprocessor system may be one wherein the number of the plurality of simulated processors does not exceed the number of the plurality of cores.
The multi-core microprocessor system may be one configured to repeat for a set of consecutive timeslices.
The multi-core microprocessor system may be one configured to ensure correct synchronization of a plurality of simulated processors, the plurality of simulated processors running on a plurality of cores, the system configured to run a timeslice of the plurality of simulated processors running on the plurality of cores, the system configured to:
run each processor on a core, and for each processor, suspend the processor if a synch event is found, or run the processor to the end of the timeslice, if a synch event is not found.

The multi-core microprocessor system may be one configured to:
(i) determine an instruction list for each processor for the timeslice;
(ii) allocate processors which have not yet been simulated in the timeslice to run on any available cores;

(iii) if a synch event is found for a processor, run the processor to just before the synch event, suspend the processor, and save the simulation time and the simulation state of the processor;

(iv) if a synch event is not found for a processor, run to the end of the timeslice and save the simulation state of the processor as it completes the timeslice, and (v) return to (ii) unless the plurality of processors have all been simulated in this timeslice.

The multi-core microprocessor system may be one configured to complete a timeslice of a simulation of a plurality of processors running on a plurality of cores, in which a plurality of processors have been suspended, the system configured to:

run the suspended processors, consecutively in the order of their earliest simulation time, on the same core, to ensure data structure consistency.

The multi-core microprocessor system may be one configured to:

(i) read a list of remaining suspended processors;

(ii) check the simulation time for each suspended processor;

(iii) run the processor with the earliest simulation time, and remove that processor from the list;

(iv) if a synch event is found, suspend the process, save the simulation state and time, add the processor back to the list of remaining suspended processors and return to (i);

(v) run to the end of the timeslice and save the simulation, and (vi) repeat items (i) to (v) until the list is empty, wherein item (iii) is performed on the same core, to ensure data structure consistency.

The multi-core microprocessor system may be one further configured to timeslice instruction sets for a plurality of processors to be simulated using a plurality of cores, the system configured to:

(i) determine a timeslice time period;

(ii) for each processor model, consult a record of its timing information;

(iii) for each simulated processor, estimate how many instructions will be run in the time period, using the results of (ii);

(iv) determine an instruction list for each simulated processor, according to the results of (iii), for a timeslice.

The multi-core microprocessor system may be further configured to:

(v) repeat (i) to (iv) for a set of consecutive timeslices.

The multi-core microprocessor system may be one wherein a time period is user-defined.

The multi-core microprocessor system may be one wherein a time period is pre-defined.

The multi-core microprocessor system may be one wherein a single core runs a single processor's instruction list at any one time.

According to a third aspect of the invention, there is provided a computer program product operable to run a plurality of simulated processors on a plurality of cores, in which simulation of the processors is performed in parallel on the plurality of cores.

The computer program product may be operable to complete a timeslice of a simulation of the plurality of simulated processors runnable on the plurality of cores, the computer program product operable to:

(i) determine an instruction list for each processor for the timeslice;

(ii) allocate processors which have not yet been simulated in the timeslice to run on any available cores;

(iii) for each allocated processor, run to the end of the timeslice and save the simulation state of the processor as it completes the timeslice, and (iv) return to (ii) unless the plurality of processors have all been simulated in this timeslice.

The computer program product may be one wherein the number of the plurality of simulated processors exceeds the number of the plurality of cores.

The computer program product may be one wherein the number of the plurality of simulated processors does not exceed the number of the plurality of cores.

The computer program product may be one in which the program is executable for a set of consecutive timeslices.

The computer program product may be one further operable to ensure correct synchronization of a plurality of simulated processors, the plurality of simulated processors runnable on a plurality of cores, the computer program product operable to apply to a timeslice of the plurality of simulated processors running on the plurality of cores, the computer program product operable to:

run each processor on a core, and for each processor, suspend the processor if a synch event is found, or run the processor to the end of the timeslice, if a synch event is not found.

The computer program product may be one further operable to:

(i) determine an instruction list for each processor for the timeslice;

(ii) allocate processors which have not yet been simulated in the timeslice to run on any available cores;

(iii) if a synch event is found for a processor, run the processor to just before the synch event, suspend the processor, and save the simulation time and the simulation state of the processor;

(iv) if a synch event is not found for a processor, run to the end of the timeslice and save the simulation state of the processor as it completes the timeslice, and (v) return to (ii) unless the plurality of processors have all been simulated in this timeslice.

The computer program product may be one further operable to complete a timeslice of a simulation of a plurality of processors running on a plurality of cores, in which a plurality of processors have been suspended, operable to:

run the suspended processors, consecutively in the order of their earliest simulation time, on the same core, to ensure data structure consistency.

The computer program product may be one operable to:

(i) read a list of remaining suspended processors;

(ii) check the simulation time for each suspended processor;

(iii) run the processor with the earliest simulation time, and remove that processor from the list;

(iv) if a synch event is found, suspend the process, save the simulation state and time, add the processor back to the list of remaining suspended processors and return to (i);

(v) run to the end of the timeslice and save the simulation, and (vi) repeat (i) to (v) until the list is empty, wherein (iii) is performed on the same core, to ensure data structure consistency.

The computer program product may be one further operable to timeslice instruction sets for a plurality of processors to be simulated using a plurality of cores, operable to:

(i) determine a timeslice time period;

(ii) for each processor model, consult a record of its timing information;

(iii) for each simulated processor, estimate how many instructions will be run in the time period, using the results of (ii);

(iv) determine an instruction list for each simulated processor, according to (iii), for a timeslice.

The computer program product may be one further operable to:

(v) repeat (i) to (iv) for a set of consecutive timeslices.

The computer program product may be one wherein a time period is user-defined.

The computer program product may be one wherein a time period is pre-defined.

The computer program product may be one wherein a single core runs a single processor's instruction list at any one time.

There is provided a computer including a multi-core microprocessor system of any aspect of the second aspect of the invention.

BRIEF DESCRIPTION OF THE DRAWINGS

The above and other aspects of the invention will now be described, by way of example only, with reference to the following Figures, in which.

DETAILED DESCRIPTION

There is provided a method of fast multi-processor simulation on multi-core machines. The technique uses the fact that, the majority of time, the processors will be working independently of each other. Hence it is possible to run the simulated processors independently on each of the cores, as far as the number of cores allows, for most of the time. Special care may only be required when inter-processor communication takes place, either directly or by access to the same data.

Simulation of Parallel Processors

Figure 1:
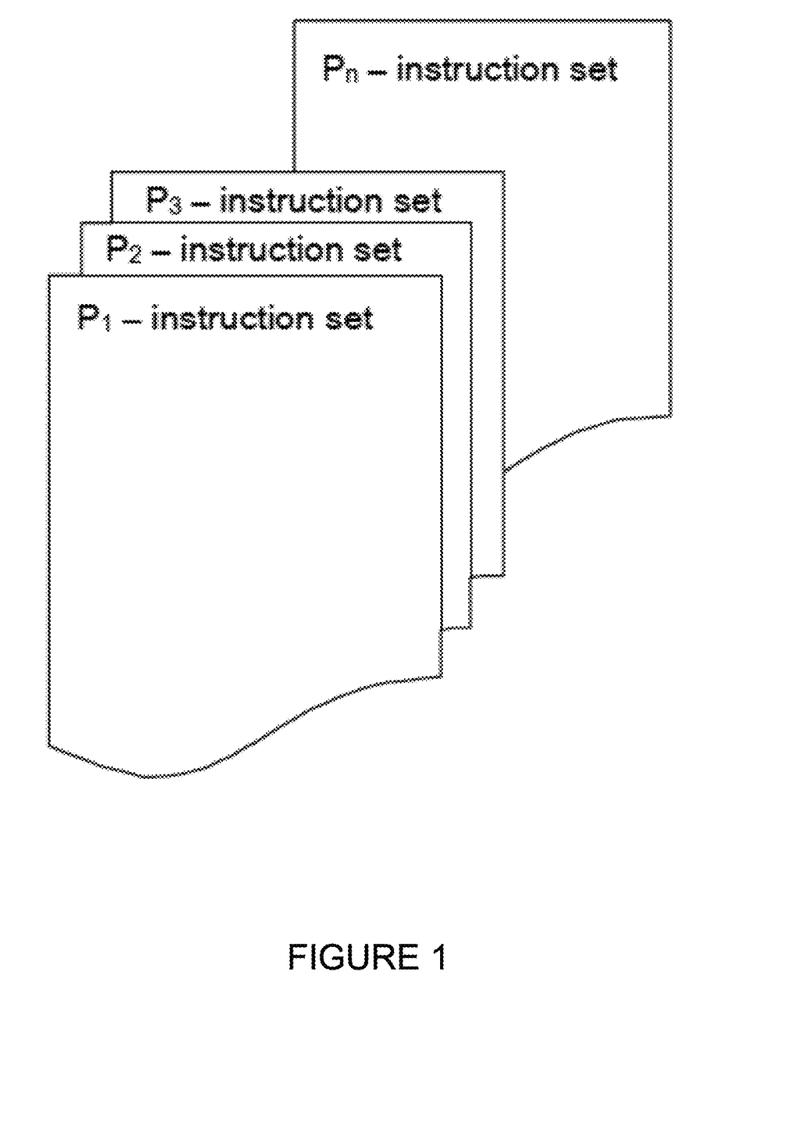
FIG. 1 shows a schematic example of instruction sets for each of n Processors (P1-Pn).
Figure 2:
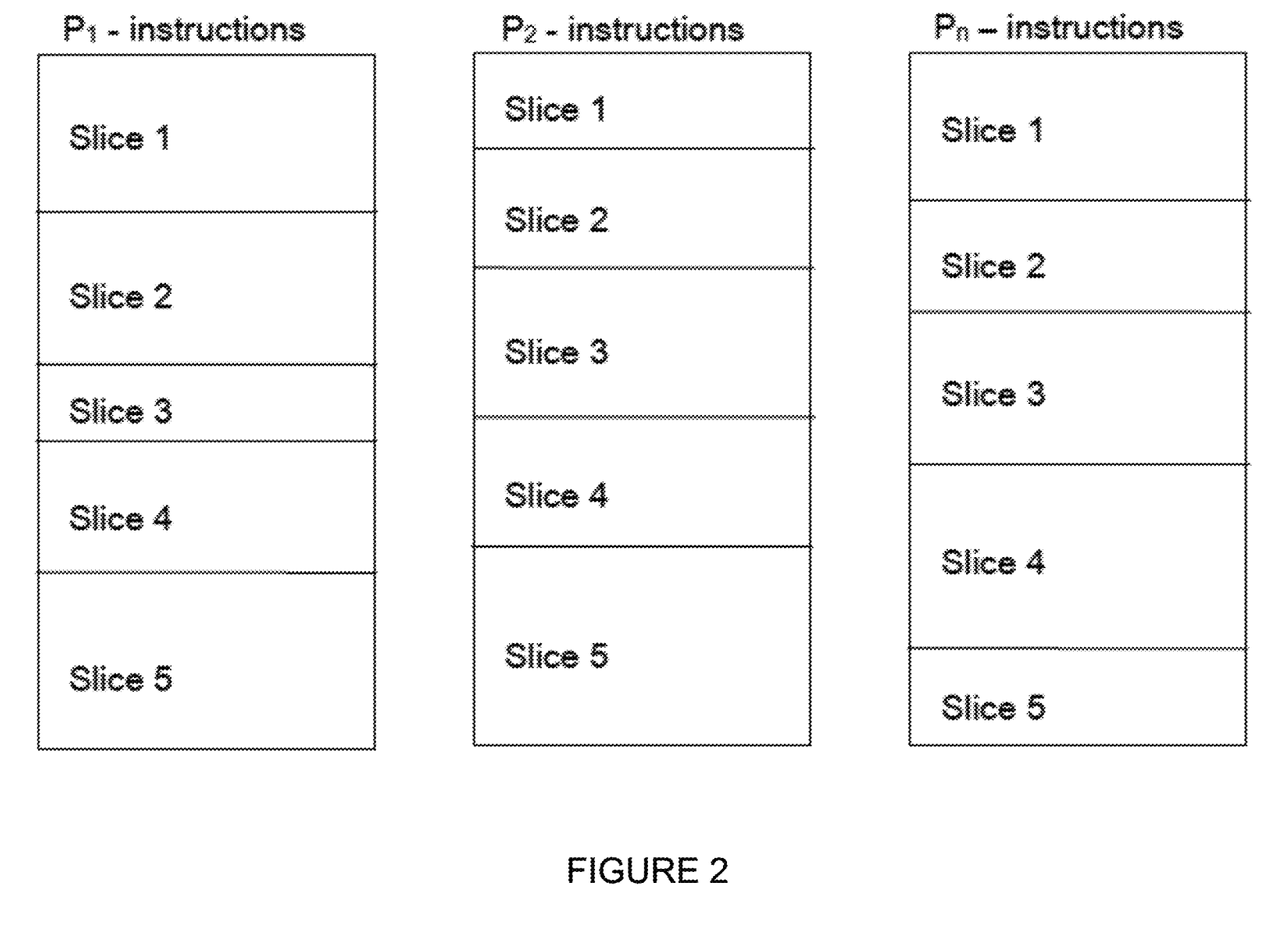
FIG. 2 shows a schematic example in which instruction sets are split into timeslices which represent different numbers of instructions per processor.

Each of the processors included in the simulation has an instruction set associated with it. See FIG. 1 for example. At the start of the simulation, the instruction set is split into a number of time periods or "timeslices". Each timeslice represents a different number of instructions for each processor. See FIG. 2 for example. A timeslice period can be either user defined or set by the system.

Once the length of the timeslice has been determined, an estimate is made (see FIG. 3 for example) of how many instructions each simulated processor will run in this time period 300. The number of instructions per processor is estimated using the timing information in the processor model which forms part of the simulation. An algorithm is then used to allocate the simulated processors to the available cores for each timeslice.

Figure 3:
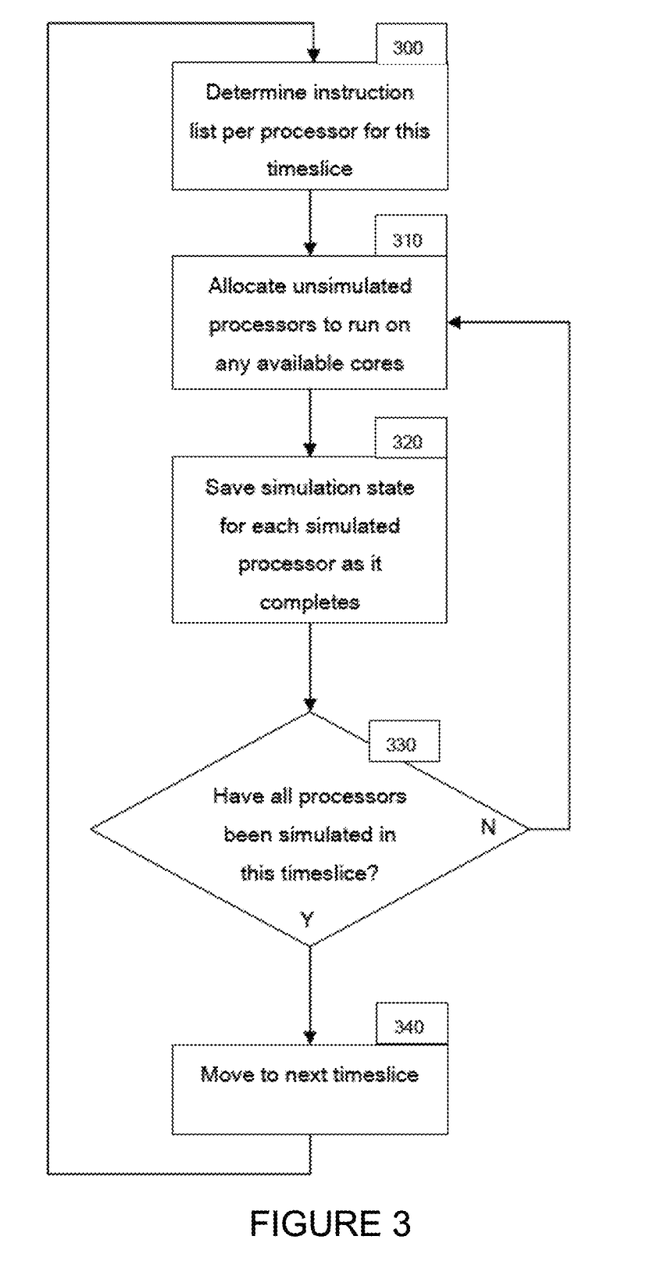
FIG. 3 shows an example of a simple algorithm for the allocation of simulated processors to the available cores to run for a given timeslice.

Once the instruction lists have been determined for each processor for the timeslice, the next task is to run each simulated processor's instruction list on one of the cores available within the machine or machines on which the simulation is to be run. A single core runs a single processor's instruction list at any one time. The instruction list is allocated to one of the cores available 310. If the number of available cores is greater than the number of simulated processors then all the simulated processors will be run concurrently, with each instruction set being run as an independent process, each on a different core. If, as is more likely, the number of simulated processors exceeds the number of cores available then an alternative technique needs to be employed. In this case, if there are M cores and N simulated processors, the first M processors will be run through the first timeslice. Each of the simulated processors is run in a process on a separate core in the machine.

Generally during the simulation, each processor can run independently until the end of the timeslice. As each of the simulated processors reaches the end of the set of instructions allocated to it for that timeslice, it is marked as complete and the state of the simulated processor is saved 320. Once this process is complete, a new set of instructions for the same timeslice but for a different simulated processor is allocated to that core. This continues until all of the simulated processors' instruction sets have been run 330. If a particular core reaches the end of the instruction set for a given timeslice and there are no further processor instructions sets to be simulated for that timeslice, then the core process sleeps until all the other active cores have completed the instruction sets for that timeslice. When all instruction sets for a given timeslice have been completed, the simulation will repeat the process for the next timeslice 340.

Inter-Processor Communication and Synchronization

The detail described above assumes that there is no interaction taking place between the simulated processors and each can therefore be allowed to run entirely independently of the other simulated processors in the system. This is unlikely to be the case for the entire simulation as there are a number of types of event which could invalidate this assumption. A simulated processor may need to communicate with another by writing to a communication channel, an example of which could be a shared memory or a FIFO (First In, First Out). In this case, the order in which the data is read and written needs to be managed carefully to ensure that the correct data is read. It is also possible that one or more of the simulated processors may need to perform some input or output to the overall system or a simulated processor may also need to update critical simulator structures such as the allocation, or reallocation, of memory. In each of these cases, and any other cases requiring synchronisation, an additional step must be followed to ensure that all simulated processors are correctly synchronised with the rest of the system. See FIG. 4 for example.

Figure 4:
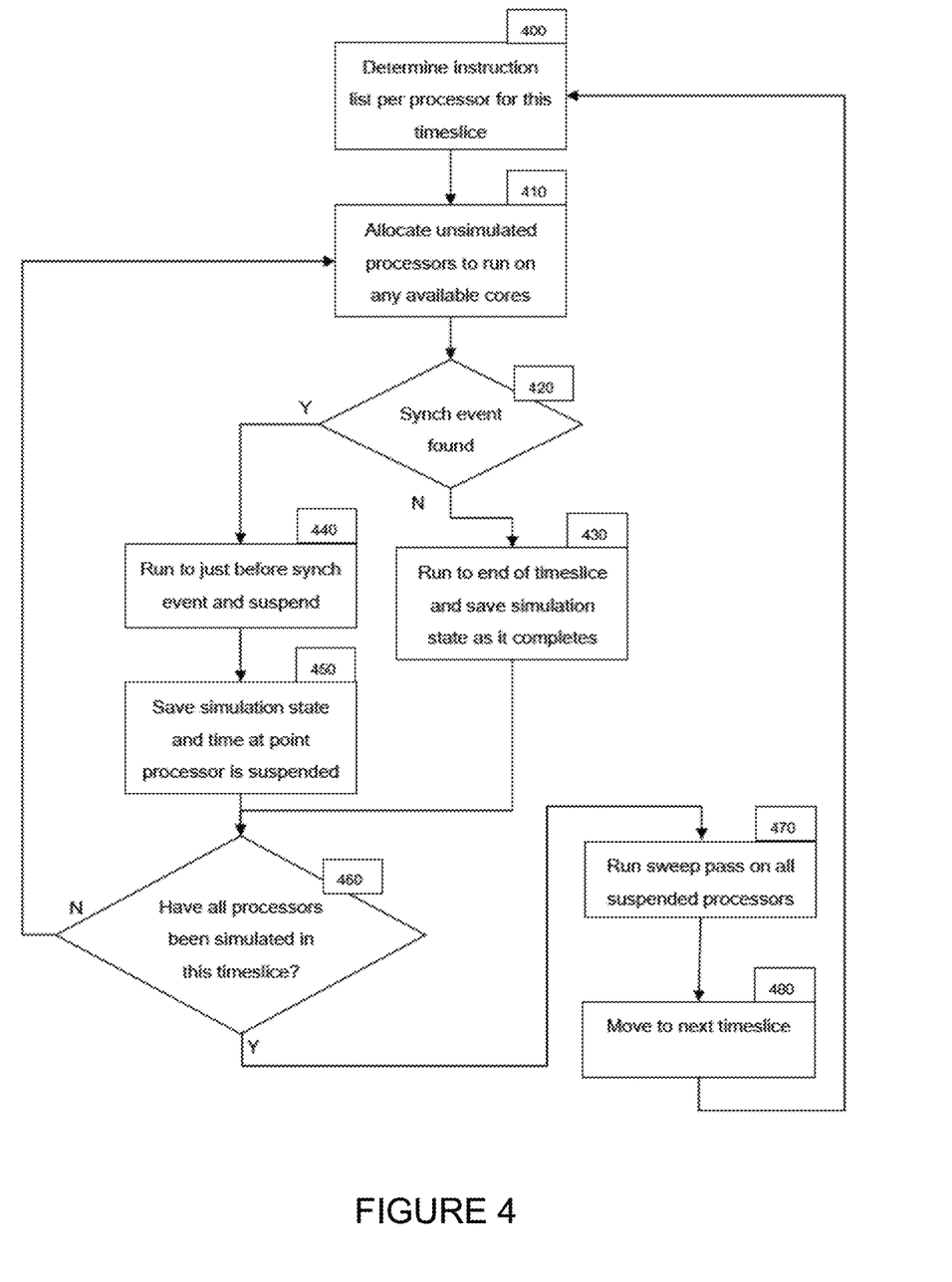
FIG. 4 shows an example of a modified algorithm to deal with synchronisation of processors.

The initial steps for a timeslice containing a synchronisation event are identical to those without such an event. First the instruction list for each processor is determined for the timeslice 400. Next, processors which have not been simulated in this timeslice are allocated to run on any available cores 410. This runs either until completion of the instruction list for that processor within the given timeslice as before 430 or until a synchronisation event is encountered 440. If a synchronisation event is found within the instruction list for any given processor then that processor runs just to just before the synchronisation event and is suspended 440. The simulation state and time at the point of suspension are recorded. This frees this core and, just as in the simple algorithm, it now checks to see if there are any further processors which need to be simulated. If there are, the next one is allocated to the core which has just completed the process with the synchronisation event; if not the core process sleeps.

When all the simulated processors have either completed or been suspended by a synchronisation event 460, an additional step, known as a sweep pass 470, needs to be performed for each of the suspended processors before moving to the next timeslice 480.

This sweep pass is performed for each of the suspended processors in turn. See FIG. 5 for example. Each of these processors is run consecutively on a single core to ensure data structure consistency. The suspended processors will still have instructions for the current timeslice to complete 500, as they have been suspended before reaching the end of the timeslice. For each timeslice the simulation must verify whether there are suspended processors or not and run the sweep pass on each one until all have run to the list of instructions allocated for the timeslice 510. The simulation time of each suspended processor was saved along with the simulation state as the processor was suspended. The simulator will compare the saved simulation times 520, at which each processor was suspended, to find the one that has the earliest simulation time 530. This processor will be the one which had the first synchronisation event. It will now be restarted from the saved state and time data and will be allowed to run, either to completion or until the next communication event 540. If the simulated processor runs to completion on the sweep pass, it will complete normally to the end of the list of instructions for that timeslice and the simulation state will be saved 550.

Figure 5:
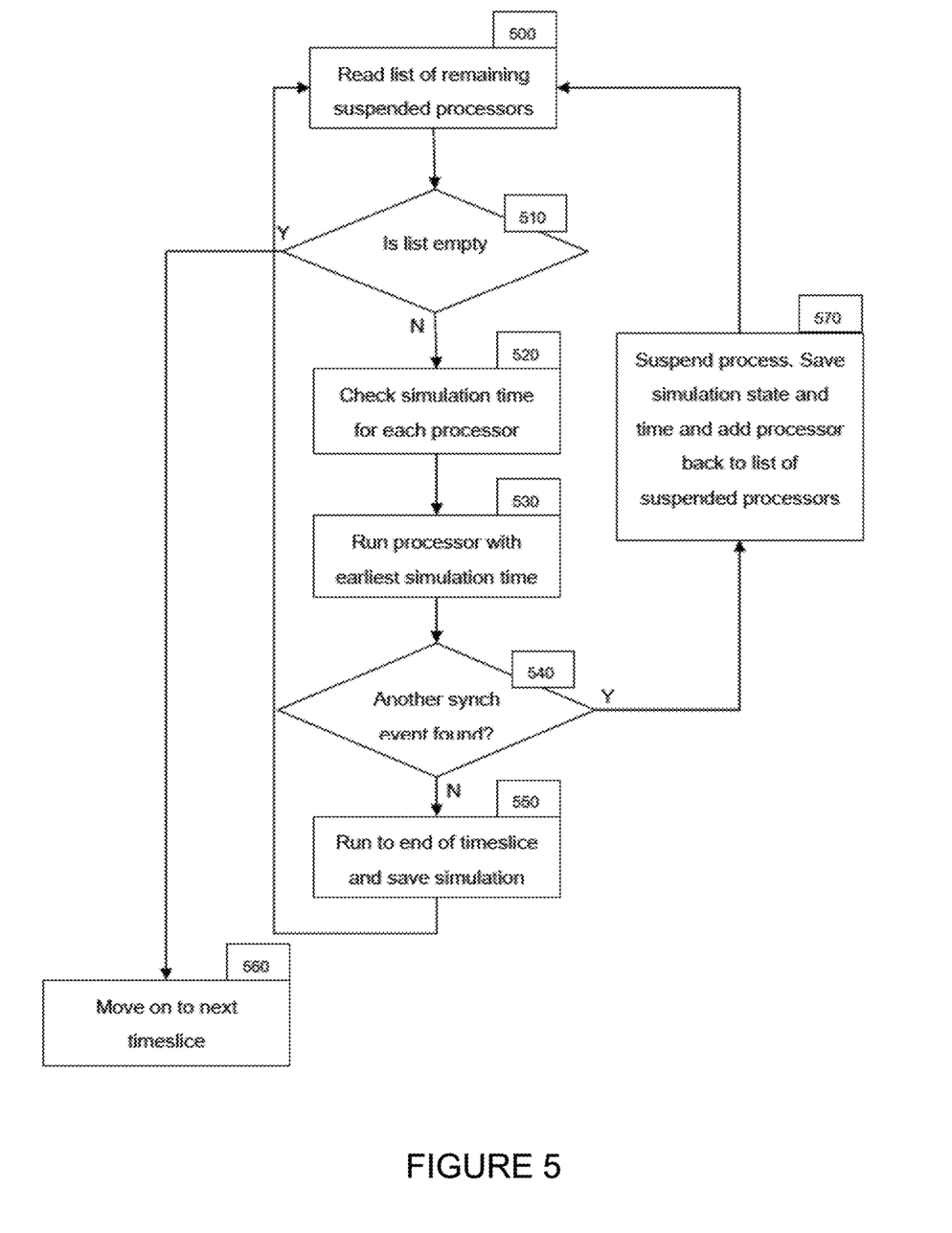
FIG. 5 shows an example of running a sweep pass for suspended processors.

The processor will then be removed from the list of those which still need to be run. If the processor has a further synchronisation event then it will again suspend just prior to that synchronisation event 570, as it did in the initial run, and simulation time and state will be saved. The suspended processor will then be re-added to the list of those which need to complete a sweep pass with new simulation time and state data. This sequence will be repeated until all the simulated processors have completed the timeslice. Once all of the sweep passes have been completed, this is the end of the timeslice and simulation will move to the next timeslice 560 and begin the process again until all the timeslices complete, marking the end of the simulation.

Note

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred example(s) of the invention, it will be apparent to those of ordinary skill in the art that numerous modifications can be made without departing from the principles and concepts of the invention as set forth herein.

The invention claimed is:

1. A method comprising:
   running a plurality of simulated processors on a plurality of cores, in which simulation of the processors is performed in parallel on the plurality of cores and in which simulation of the processors is split into timeslices comprising instructions for the simulated processors; and
   ensuring correct synchronization of the plurality of simulated processors within a first of the timeslices, including: running each processor on a core, and for each simulated processor:
   suspending the instructions for the first timeslice for that simulated processor if a synch event is found within the instructions for the first timeslice for that simulated processor, or
   running the simulated processor to the end of the first timeslice, if a synch event is not found within the instructions for the first timeslice for that simulated processor.

2. The method of claim 1, further comprising:
   (i) determining an instruction list for each simulated processor for the first timeslice;
   (ii) allocating simulated processors which have not yet been simulated in the first timeslice to run on any available cores;
   (iii) for each allocated simulated processor, running to the end of the first timeslice and saving a simulation state of the simulated processor as it completes the first timeslice; and
   (iv) returning to step (ii) unless the plurality of simulated processors have all been simulated in the first timeslice.

3. The method of claim 2, wherein the number of the plurality of simulated processors exceeds the number of the plurality of cores.

4. The method of claim 2, wherein the number of the plurality of simulated processors does not exceed the number of the plurality of cores.

5. The method of claim 2, in which the method is repeated for a set of consecutive timeslices.

6. The method of claim 1, further comprising:
   (i) determining an instruction list for each simulated processor for the first timeslice;
   (ii) allocating simulated processors which have not yet been simulated in the first timeslice to run on any available cores;
   (iii) if a synch event is found for a simulated processor, running the simulated processor to just before the synch event, suspending the simulated processor, and saving a simulation time and a simulation state of the simulated processor;
   (iv) if a synch event is not found for a simulated processor, running to the end of the first timeslice and saving a simulation state of the simulated processor as it completes the first timeslice; and
   (v) returning to step (ii) unless the plurality of simulated processors have all been simulated in the first timeslice.

7. The method of claim 1, in which a plurality of the simulated processors for the first timeslice have been suspended, the method further including:
   running the suspended simulated processors, consecutively in an order of their earliest simulation times at the suspensions, on the same respective cores.

8. The method of claim 7, further comprising:
   (i) reading a list of remaining suspended simulated processors;
   (ii) checking the simulation time for each suspended simulated processor;
   (iii) running the suspended simulated processor with the earliest simulation time on the same respective core, and removing that simulated processor from the list;
   (iv) if a synch event is found, suspending the simulated processor, saving the simulation state and simulation time, adding the simulated processor back to the list of remaining suspended simulated processors and returning to step (i);

(v) running to the end of the first timeslice and saving the simulation, and (vi) repeating steps (i) to (v) until the list is empty.

9. The method of claim 1, wherein splitting the simulation of the processors into timeslices comprises:

(i) determining a timeslice time period;

(ii) for each processor model represented in the simulated processors, consulting a record of its timing information;

(iii) for each simulated processor, estimating how many instructions will be run in the timeslice time period, using the results of step (ii); and (iv) determining an instruction list for each simulated processor, according to the results of step (iii), for a timeslice.

10. The method of claim 9, further comprising:

(v) repeating steps (i) to (iv) for a set of consecutive timeslices.

11. The method of claim 9, wherein the timeslice time period is user-defined.

12. The method of claim 9, wherein the timeslice time period is pre-defined.

13. The method of claim 1, wherein a single core runs a single simulated processor's instruction list at any one time.

14. A multi-core microprocessor system comprising a plurality of cores, the system configured to:

run a plurality of simulated processors on the plurality of cores, in which simulation of the processors is performable in parallel on the plurality of cores and in which simulation of the processors is split into timeslices comprising instructions for the simulated processors; and ensure correct synchronization of the plurality of simulated processors within a first of the timeslices, including for each simulated processor:

suspend the instructions for the first timeslice for that simulated processor if a synch event is found within the instructions for the first timeslice for that simulated processor.

15. The multi-core microprocessor system of claim 14, further configured to:

(i) determine an instruction list for each simulated processor for the first timeslice;

(ii) allocate simulated processors which have not yet been simulated in the first timeslice to run on any available cores;

(iii) for each allocated simulated processor, run to the end of the first timeslice and save a simulation state of the simulated processor as it completes the first timeslice; and (iv) return to (ii) unless the plurality of simulated processors have all been simulated in the first timeslice.

16. The multi-core microprocessor system of claim 15, wherein the number of the plurality of simulated processors exceeds the number of the plurality of cores.

17. The multi-core microprocessor system of claim 15, wherein the number of the plurality of simulated processors does not exceed the number of the plurality of cores.

18. The multi-core microprocessor system of claim 15, configured to repeat for a set of consecutive timeslices.

19. The multi-core microprocessor system of claim 14, further configured to:

(i) determine an instruction list for each simulated processor for the first timeslice;

(ii) allocate simulated processors which have not yet been simulated in the first timeslice to run on any available cores;

(iii) if a synch event is found for a simulated processor, run the simulated processor to just before the synch event, suspend the simulated processor, and save a simulation time and a simulation state of the simulated processor;

(iv) if a synch event is not found for a simulated processor, run to the end of the first timeslice and save a simulation state of the simulated processor as it completes the first timeslice; and (v) return to (ii) unless the plurality of simulated processors have all been simulated in the first timeslice.

20. The multi-core microprocessor system of claim 14, system configured to complete a timeslice of a simulation of a plurality of processors running on in which a plurality of the simulated processors for the first timeslice have been suspended, the system further configured to:

run the suspended simulated processors, consecutively in an order of their simulation times at the suspensions, on the same respective cores.

21. The multi-core microprocessor system of claim 20, further configured to:

(i) read a list of remaining suspended simulated processors;

(ii) check the simulation time for each suspended simulated processor;

(iii) run the suspended simulated processor with the earliest simulation time on the same respective core, and remove that simulated processor from the list;

(iv) if a synch event is found, suspend the simulated processor, save the simulation state and simulation time, add the simulated processor back to the list of remaining suspended simulated processors and return to (i);

(v) run to the end of the first timeslice and save the simulation, and (vi) repeat (i) to (v) until the list is empty.

22. The multi-core microprocessor system of claim 14, further configured to:

(i) determine a timeslice time period;

(ii) for each processor model represented in the simulated processors, consult a record of its timing information;

(iii) for each simulated processor, estimate how many instructions will be run in the timeslice time period, using the results of (ii);

(iv) determine an instruction list for each simulated processor, according to the results of (iii), for a timeslice.

23. The multi-core microprocessor system of claim 22, further configured to:

(v) repeat (i) to (iv) for a set of consecutive timeslices.

24. The multi-core microprocessor system of claim 22, wherein the timeslice time period is user-defined.

25. The multi-core microprocessor system of claim 22, wherein the timeslice time period is pre-defined.

26. The multi-core microprocessor system of claim 14, wherein a single core runs a single simulated processor's instruction list at any one time.

27. A computer program product stored on a non-transitory machine-readable medium, the computer program product comprising stored instructions, which when executed by a processing device, cause the processing device to:

run a plurality of simulated processors on a plurality of cores, in which simulation of the processors is performed in parallel on the plurality of cores and in which simulation of the processors is split into timeslices comprising instructions for the simulated processors; and ensure correct synchronization of the plurality of simulated processors within a first of the timeslices, including for each simulated processor:

run the simulated processor to the end of the first timeslice, if a synch event is not found within the instructions for the first timeslice for that simulated processor.

28. The computer program product of claim 27, further executable to:

(i) determine an instruction list for each simulated processor for the first timeslice;

(ii) allocate simulated processors which have not yet been simulated in the first timeslice to run on any available cores;

(iii) for each allocated simulated processor, run to the end of the first timeslice and save a simulation state of the simulated processor as it completes the first timeslice; and (iv) return to (ii) unless the plurality of simulated processors have all been simulated in the first timeslice.

29. The computer program product of claim 28, wherein the number of the plurality of simulated processors exceeds the number of the plurality of cores.

30. The computer program product of claim 28, wherein the number of the plurality of simulated processors does not exceed the number of the plurality of cores.

31. The computer program product of claim 28, in which the computer program product is executable for a set of consecutive timeslices.

32. The computer program product of claim 27, further executable to:

(i) determine an instruction list for each simulated processor for the first timeslice;

(ii) allocate simulated processors which have not yet been simulated in the first timeslice to run on any available cores;

(iii) if a synch event is found for a simulated processor, run the simulated processor to just before the synch event, suspend the simulated processor, and save a simulation time and a simulation state of the simulated processor;

(iv) if a synch event is not found for a simulated processor, run to the end of the first timeslice and save a simulation state of the simulated processor as it completes the first timeslice; and (v) return to (ii) unless the plurality of simulated processors have all been simulated in the first timeslice.

33. The computer program product of claim 27, in which a plurality of the simulated processors for the first timeslice have been suspended, further executable to:

run the suspended simulated processors, consecutively in an order of their simulation times at the suspensions, on the same respective cores.

34. The computer program product of claim 33, further executable to:

(i) read a list of remaining suspended simulated processors;

(ii) check the simulation time for each suspended simulated processor;

(iii) run the suspended simulated processor with the earliest simulation time on the same respective core, and remove that simulated processor from the list;

(iv) if a synch event is found, suspend the simulated processor, save the simulation state and simulation time, add the simulated processor back to the list of remaining suspended simulated processors and return to (i);

(v) run to the end of the first timeslice and save the simulation, and (vi) repeat (i) to (v) until the list is empty.

35. The computer program product of claim 27, further executable to:

(i) determine a timeslice time period;

(ii) for each processor model represented in the simulated processors, consult a record of its timing information;

(iii) for each simulated processor, estimate how many instructions will be run in the timeslice time period, using the results of (ii);

(iv) determine an instruction list for each simulated processor, according to (iii), for a timeslice.

36. The computer program product of claim 35, further executable to:

(v) repeat (i) to (iv) for a set of consecutive timeslices.

37. The computer program product of claim 35, wherein the timeslice time period is user-defined.

38. The computer program product of claim 35, wherein the timeslice time period is pre-defined.

39. The computer program product of claim 27, wherein a single core runs a single simulated processor's instruction list at any one time.

* * * * *